(12) United States Patent
Yoshioka et al.

(10) Patent No.: US 10,486,903 B2
(45) Date of Patent: Nov. 26, 2019

(54) ARTICLE TRANSPORT FACILITY

(71) Applicant: Daifuku Co., Ltd., Osaka-shi (JP)

(72) Inventors: Hideo Yoshioka, Hinocho (JP); Kenichi Tanaka, Hinocho (JP); Ryoji Morishita, Hinocho (JP)

(73) Assignee: Daifiki Co., Ltd., Osaka-shi (JP)

( * ) Notice: Subject to any disclaimer, the term of this patent is extended or adjusted under 35 U.S.C. 154(b) by 95 days.

(21) Appl. No.: 15/389,511

(22) Filed: Dec. 23, 2016

(65) Prior Publication Data

US 2017/0183156 A1 Jun. 29, 2017

(30) Foreign Application Priority Data

Dec. 24, 2015 (JP) .................................. 2015-251270

(51) Int. Cl.
*B65G 1/137* (2006.01)
*H01L 21/677* (2006.01)
*B65G 1/04* (2006.01)

(52) U.S. Cl.
CPC ........... *B65G 1/137* (2013.01); *B65G 1/0407* (2013.01); *B65G 1/0457* (2013.01); *H01L 21/6773* (2013.01); *H01L 21/67769* (2013.01); *B65G 2201/0297* (2013.01)

(58) Field of Classification Search
CPC ................ B65G 1/0457; B65G 1/137; B65G 2201/0297; B65G 1/0407; H01L 21/6773; H01L 21/67769; Y01S 414/14
USPC ...................................................... 187/249
See application file for complete search history.

(56) References Cited

U.S. PATENT DOCUMENTS

| | | | |
|---|---|---|---|
| 5,468,112 A * | 11/1995 | Ishii | H01L 21/6732 118/500 |
| 5,651,426 A * | 7/1997 | Bittar | B66B 1/2458 187/249 |
| 5,980,183 A * | 11/1999 | Fosnight | H01L 21/67727 414/222.01 |
| 7,976,260 B2 * | 7/2011 | Hirata | B23Q 7/045 198/346.2 |
| 9,221,604 B2 * | 12/2015 | Takagawa | B65G 1/0421 |
| 9,245,782 B2 * | 1/2016 | Yoshioka | H01L 21/67359 |

(Continued)

FOREIGN PATENT DOCUMENTS

| | | |
|---|---|---|
| JP | 4820797 | 6/1973 |
| JP | 59223602 A | 12/1984 |
| JP | 2004345838 A | 12/2004 |

(Continued)

*Primary Examiner* — James Keenan
(74) *Attorney, Agent, or Firm* — The Webb Law Firm

(57) ABSTRACT

A first guiding body and a second guiding body are arranged in a positional relationship according to which the position in the vertical direction of the upper end portion of a first movement path of a first moving body and the position in the vertical direction of the lower end portion of a second movement path of a second moving body are overlapped with each other. The first moving body includes a first transfer apparatus, and the second moving body includes a second transfer apparatus. Relay support platforms that can support articles are arranged at positions that are not overlapped with the first movement path or the second movement path, and that enable the articles to be transferred from both the first transfer apparatus and the second transfer apparatus.

20 Claims, 8 Drawing Sheets

(56) References Cited

U.S. PATENT DOCUMENTS 9,815,624 B2 * 11/2017 Yoshioka ................ B65G 1/06
2015/0262855 A1 * 9/2015 Yoshioka .......... H01L 21/67769
414/277

FOREIGN PATENT DOCUMENTS

| JP | 2006248690 A | | 9/2006 | |
|---|---|---|---|---|
| JP | 2009029568 A | * | 2/2009 | ........... B65G 1/0407 |
| JP | 201166046 A | | 3/2011 | |
| JP | 201431271 A | | 2/2014 | |

* cited by examiner

ARTICLE TRANSPORT FACILITY

CROSS-REFERENCE TO RELATED APPLICATION

This application claims priority to Japanese Patent Application No. 2015-251270 filed Dec. 24, 2015, the disclosure of which is hereby incorporated in its entirety by reference.

FIELD OF THE INVENTION

The present invention relates to an article transport facility that includes moving bodies for article transport that move along the vertical direction.

BACKGROUND

JP 2011-066046A discloses an example of an article transport facility that has multiple vertical transport apparatuses (4) for transporting articles between transport target locations that are set at different floors in a semiconductor manufacturing factory that has multiple floors (1, 2, 1) in the vertical direction (note that the reference signs in parentheses in this section are reference signs used in the cited document (e.g., FIG. 1)). In the aforementioned document, a vertical transport apparatus (4) is provided for transporting articles between a stocker-only floor (2) and a second floor (1) that is higher than the stocker-only floor (2), and a separate vertical transport apparatus (4) is provided for transporting articles between the stocker-only floor (2) and a first floor (1) that is lower than the stocker-only floor (2). In other words, a second-floor vertical transport apparatus (4) and a first-floor vertical transport apparatus (4) are installed at different locations in a view along the vertical direction.

In order to provide the article transport facility in an installation region that is compact in a view along the vertical direction, it is preferable that a single vertical transport apparatus (4) connects the first floor (1) and the second floor (1) across the stocker-only floor (2). However, when moving the article transport moving body a long distance in the vertical direction, if a belt-driven technique for example is employed, various problems related to the long transport distance arise, such as the problem of meandering of the lengthy driving belt. For this reason, in an article transport facility for transporting articles over relatively long distances in the vertical direction, there are cases where the vertical transport section is divided and assigned to different vertical transport apparatuses.

FIG. 8 shows one example of such a vertical transport facility. As shown in FIG. 8, an apparatus assigned to the lower floors (lower-floor transport apparatus K21 in FIG. 8) and an apparatus assigned to the upper floors (upper-floor transport apparatus K22 in FIG. 8) are provided as vertical transport apparatuses. The lower-floor transport apparatus K21 and the upper-floor transport apparatus K22 are provided in a positional relationship according to which the upper end portion of the vertical transport range of the lower-floor transport apparatus K21 is overlapped in the vertical direction with the lower end portion of the vertical transport range of the upper-floor transport apparatus K22 (i.e., a positional relationship of being overlapped in a view along a lateral direction that is orthogonal to the vertical direction), and in a positional relationship of being separated from each other in a view along the vertical direction.

A horizontal transport apparatus V (e.g., a carriage or roller conveyor) is provided at the floor that is in the range where the lower-floor transport apparatus K21 and the upper-floor transport apparatus K22 are overlapped in the vertical direction, and the horizontal transport apparatus V transports articles in the horizontal direction between a moving body T of the upper-floor transport apparatus K22 and a moving body T of the upper-floor transport apparatus K22. Specifically, the lower-floor transport apparatus K21 delivers an article to the horizontal transport apparatus V, and the horizontal transport apparatus V transports the article and delivers it to the upper-floor transport apparatus K22, thus making it possible to transport articles from a lower floor and to an upper floor. Also, conversely, the upper-floor transport apparatus K22 delivers an article to the horizontal transport apparatus V, and the horizontal transport apparatus V transports the article and delivers it to the lower-floor transport apparatus K21, thus making it possible to transport articles from an upper floor and to a lower floor.

In this way, by using the horizontal transport apparatus V to transport articles between the two vertical transport apparatuses, it is possible to appropriately transport articles even in the case where the vertical transport distance for a transport target article is long. However, in a configuration such as that shown in FIG. 8, a transport apparatus for transporting articles in the horizontal direction needs to be installed in addition to the transport apparatuses for transporting articles in the vertical direction, and a large installation space is required in order to provide all of these transport apparatuses.

SUMMARY OF THE INVENTION

In view of this, there is desire for an article transport facility that can appropriately transport articles even when the transport distance in the vertical direction is long, and moreover that is advantageous in terms of installation space.

In light of the above-described circumstances, an article transport facility according to one aspect of the present invention is an article transport facility for transporting an article along a vertical direction, the article transport facility including:

a first guiding body arranged to extend along the vertical direction;

a second guiding body arranged to extend along the vertical direction;

a first moving body for article transport that is guided by the first guiding body and moves along the first guiding body;

a second moving body for article transport that is guided by the second guiding body and moves along the second guiding body; and a relay support platform that can support the article, wherein the first moving body includes a first transfer apparatus that transfers the article to and from a transfer target location, the second moving body includes a second transfer apparatus that transfers the article to and from a transfer target location, letting a movement path of the first moving body be a first movement path, and letting a movement path of the second moving body be a second movement path, the first guiding body and the second guiding body are arranged in a positional relationship according to which a position in the vertical direction of an upper end portion of the first movement path and a position in the vertical direction of a lower end portion of the second movement path are overlapped with each other, and the relay support platform is arranged at a position that is not overlapped with either the first movement path or the second movement path, and that enables the article to be transferred from both the first transfer apparatus and the second transfer apparatus.

In other words, the first moving body and the second moving body can transfer the article via the relay support platform, and therefore the transport target article can be appropriately transported in the vertical direction even over a long distance that spans the first movement path and the second movement path. Also, the first moving body and the second moving body can relay the transport target article via the relay support platform, without providing the article transport facility with a transport apparatus for transporting articles in the horizontal direction. This makes it possible to realize a reduction in installation space. In this way, according to the above configuration, it is possible to provide an article transport facility that can appropriately transport articles even when the transport distance in the vertical direction is long, and moreover that is advantageous in terms of installation space.

Note that it is preferable that the relay support platform is provided in the overlap range of the first movement path and the second movement path in the vertical direction. In other words, the first moving body and the second moving body can each be located in the overlap range, and therefore if the position of the relay support platform in the vertical direction is set inside the overlap range, the first transfer apparatus and the second transfer apparatus can both easily access the relay support platform.

Further features and advantages of the article transport facility will become apparent from the following description of embodiments with reference to the drawings.

DETAILED DESCRIPTION

Figure 1:
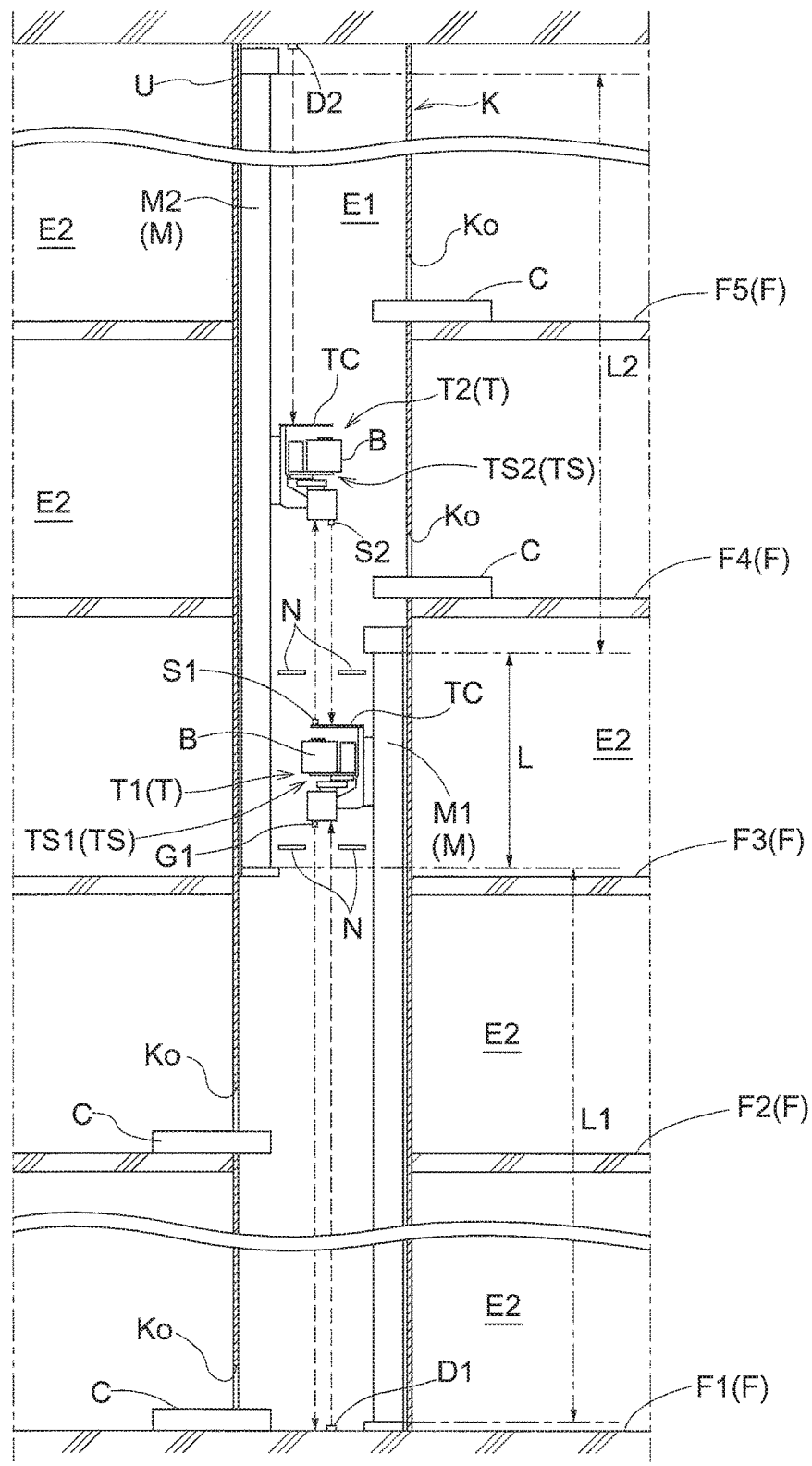
FIG. 1 is a cross-sectional side view of a relevant portion of an inter-floor transport apparatus.
Figure 2:
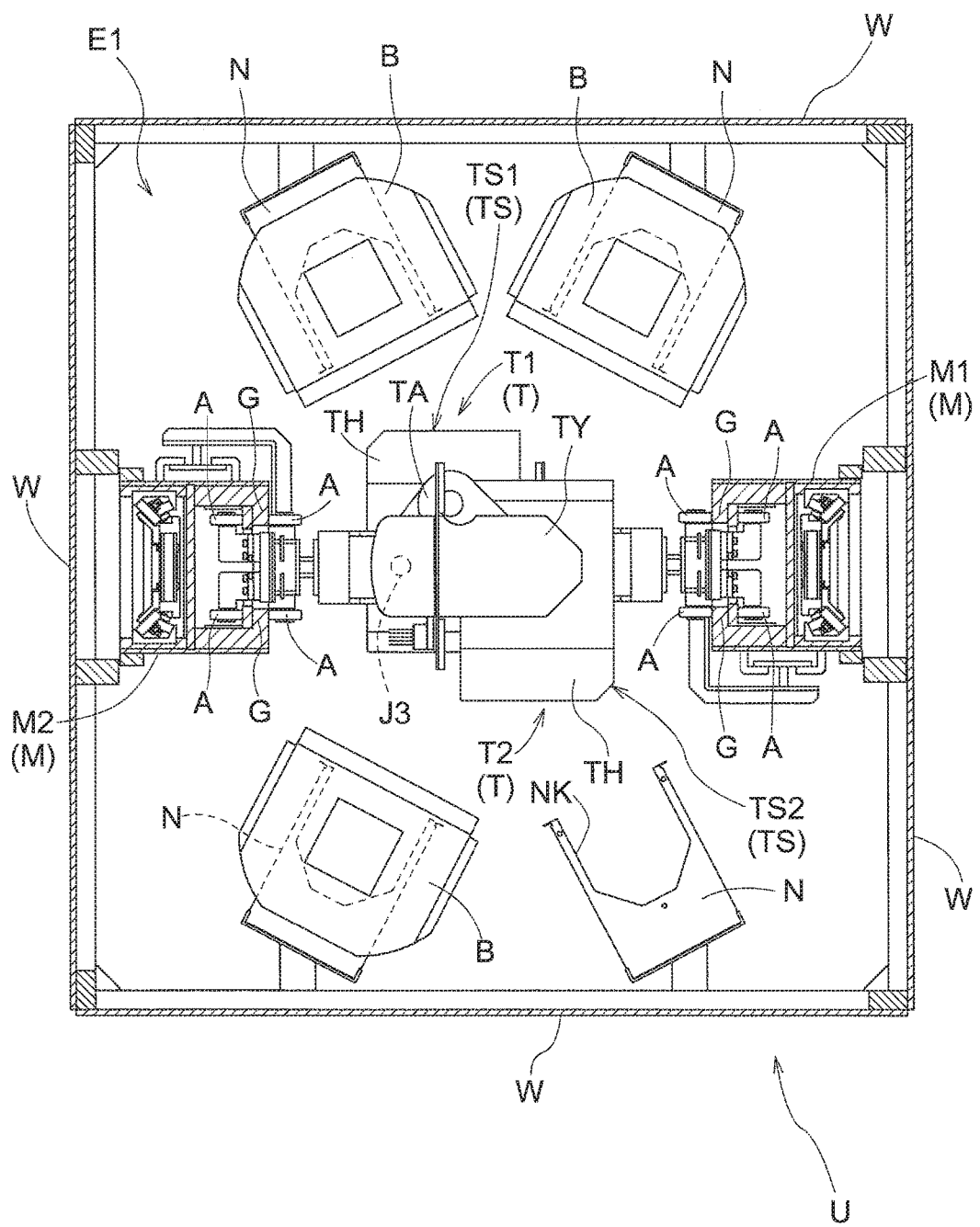
FIG. 2 is a cross-sectional view of the inter-floor transport apparatus as seen in the vertical direction.

The case of applying an article transport facility of the present invention to an inter-floor transport apparatus will be described below with reference to the drawings. As shown in FIGS. 1 and 2, an inter-floor transport apparatus K of the present embodiment is used in a semiconductor manufacturing factory that has multiple floors F (five floors from a first floor F1 to a fifth floor F5 in this embodiment), and is used to transport a container B between different floors. The container B (also called an FOUP or an FOSB) houses semiconductor substrates and is the transport target article. Although not shown in the drawings, the semiconductor manufacturing factory of the present embodiment is provided with storage apparatuses for the container B on each floor and processing devices for performing processing on semiconductor substrates that have been retrieved from the containers B.

As shown in FIG. 2, the inter-floor transport apparatus K includes a standalone tubular body U that has wall bodies W surrounding a region that is rectangular in a view along the vertical direction, and has a hollow portion that extends along the vertical direction. Guiding masts M are arranged to extend along the vertical direction (up-down direction) in an interior space E1 of the wall bodies W. Two guiding masts M are respectively provided at locations that are in the vicinity of two opposing wall bodies W, and are provided at different heights in the vertical direction. Specifically, as shown in FIG. 1, the guiding masts M are a first guiding mast M1 (first guiding body) whose lower end is at a height near the floor of the first floor F1 and whose upper end is at a height near the ceiling of the third floor F3, and a second guiding mast M2 (second guiding body) whose lower end is at a height near the floor of the third floor F3 and whose upper end is at a height near the ceiling of the fifth floor F5. Also, the first guiding mast M1 connects the lowest floor (the bottom floor, which is the first floor F1 here) and a connecting floor (the third floor F3 here), and the second guiding mast M2 connects the connecting floor and the highest floor (the top floor, which is the fifth floor F5 here).

Also, opening portions Ko that connect the interior space E1 of the tubular body U and an exterior space E2 are formed at locations corresponding to the first floor F1, the second floor F2, the fourth floor F4, and the fifth floor F5 in the tubular body U, and transfer apparatuses C for transferring containers B between the interior space E1 and the exterior space E2 via the opening portions Ko are also provided at the same locations. Note that the transfer apparatuses C may be provided adjacent to the floor surfaces, or may be provided at a location distant from the floor surfaces (e.g., near the ceilings).

As shown in FIG. 2, the first guiding mast M1 and the second guiding mast M2 are each provided with guiding portions G that extend along the lengthwise direction. The first guiding mast M1 is provided with a first moving body T1 that can move up and down in the vertical direction along the first guiding mast M1, and the second guiding mast M2 is provided with a second moving body T2 that can move up and down in the vertical direction along the second guiding mast M2. The first moving body T1 and the second moving body T2 each include guided wheels A that are guided by the guiding portions G. Note that when there is no particular need for distinction, the first guiding mast M1 and the second guiding mast M2 are collectively referred to as simply the guiding masts M (guiding bodies), and the first moving body T1 and the second moving body T2 are collectively referred to as simply the moving bodies T.

The first moving body T1 includes a first elevation main body portion TH1, a scalar arm type of delivery arm TA, and a container support body TY that supports a container B placed thereon. An elevation belt (not shown) is wound around the upper end of the first guiding mast M1, and the first elevation main body portion TH1 is driven to move up and down by a first elevation driving portion (DRV1) Tm1 (see FIG. 4) that causes the elevation belt to move in the lengthwise direction. In the present embodiment, a first transfer apparatus TS1 is configured by the delivery arm TA and the container support body TY. In other words, the first moving body T1 includes the first transfer apparatus TS1 that transfers articles to and from a transfer target location.

The second moving body T2 similarly includes a second elevation main body portion TH2, a scalar arm type of delivery arm TA, and a container support body TY that supports a container B placed thereon. An elevation belt (not shown) is wound around the upper end of the second guiding mast M2, and the second elevation main body portion TH2 is driven to move up and down by a second elevation driving portion (DRV2) Tm2 (see FIG. 4) that causes the elevation belt to move in the lengthwise direction. In the present embodiment, a second transfer apparatus TS2 is configured by the delivery arm TA and the container support body TY. In other words, the second moving body T2 includes the second transfer apparatus TS2 that transfers articles to and from a transfer target location. Note that in the following description, the term "elevation main body portions TH" will be used when collectively describing the first elevation main body portion TH1 and the second elevation main body portion TH2.

Figure 3A:
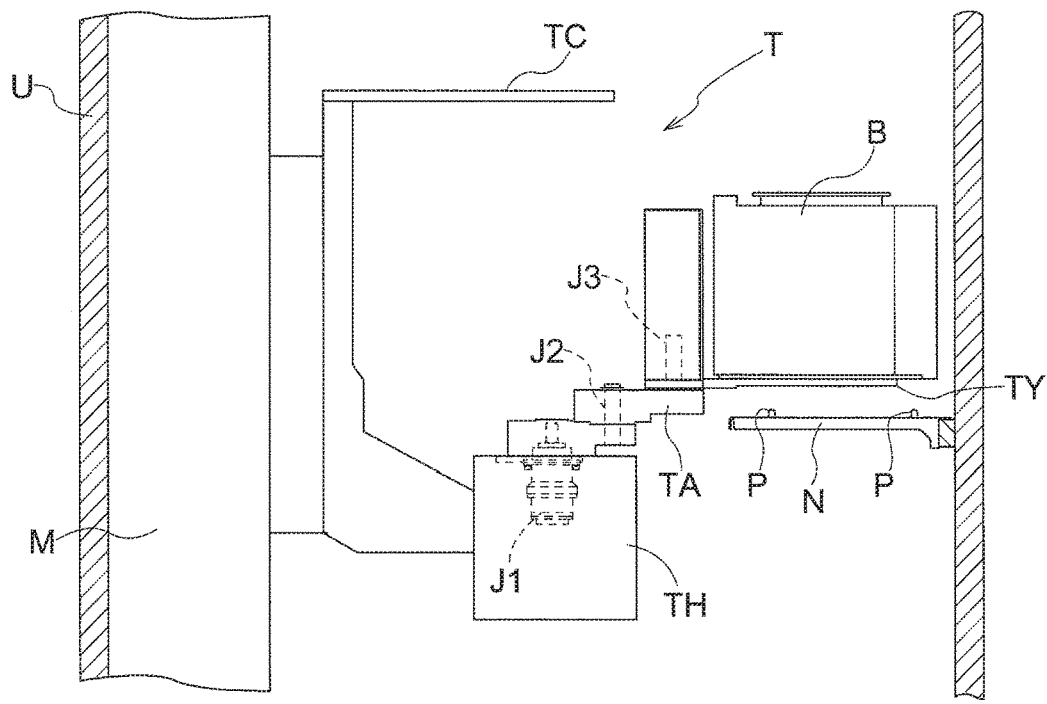
FIG. 3A is a side view of a relay support platform.
Figure 3B:
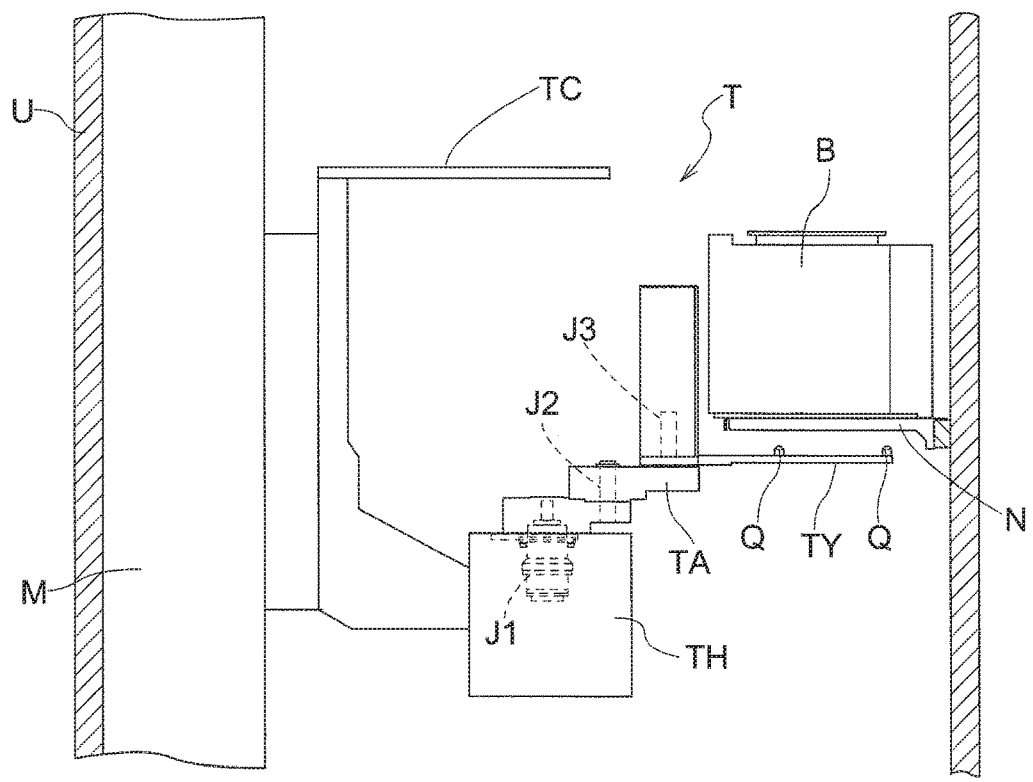
FIG. 3B is a side view of the relay support platform.

As shown in FIGS. 3A and 3B, the base end of the delivery arm TA is connected to the elevation main body portion TH via a rotation shaft J1 that extends in the vertical direction, and the leading end of the delivery arm TA is connected to the container support body TY via a rotation shaft J3 that extends in the vertical direction. Also, the delivery arm TA is configured to be capable of bending by rotating about a rotation shaft J2 that extends along the vertical direction, and the orientation of the container support body TY in a view along the vertical direction can be changed by rotation about the rotation shaft J3. According to this configuration, the container support body TY is configured to be capable of switching between a transport position and a transfer position.

As shown in FIG. 2, the transport position is a position at which the container B supported on the container support body TY is located between the first guiding mast M1 and the second guiding mast M2 in a view along the vertical direction. By switching the container support body TY to the transport position and then moving the elevation main body portion TH up/down, the container B is transported to a different floor F.

Also, as shown in FIG. 2, relay support platforms N are distributed surrounding the container support body TY at the transport position in a view along the vertical direction (although four relay support platforms are used in the present embodiment, any number may be provided). The relay support platforms N are provided at installation positions that are fixed in a view along the vertical direction, and are, with respect to the vertical direction, included in an overlap portion (later-described overlap zone L denoted by the reference sign "L" in FIG. 1) of an upper end portion of a first movement path and a lower end portion of a second movement path.

The transfer position is set as a position at which the container support body TY can pass up and down through a notch NK provided in the relay support platform N. By switching the container support body TY to the transport position and moving the elevation main body portion TH up or down, the container B is transferred between the container support body TY and the relay support platform N (see FIGS. 3A and 3B).

Note that three positioning grooves (not shown) are formed in the bottom portion of each container B. Three positioning pins Q that respectively engage with the three positioning grooves are provided on the upper surface of the container support body TY, and the container support body TY can support the container B in a predetermined orientation in a view along the vertical direction. Also, three positioning pins P that respectively engage with the three positioning grooves are provided on the upper surface of the relay support platform N as well, and the relay support platform N can support the container B in a predetermined orientation in a view along the vertical direction.

In other words, the inter-floor transport apparatus K to which the article transport facility of the present invention is applied includes guiding masts M arranged to extend along the vertical direction, and moving bodies T for article transport that are guided by the guiding masts M and move along the guiding masts M. Also, the inter-floor transport apparatus K includes a first guiding mast M1 and a second guiding mast M2 as the guiding masts M, and includes, as the moving bodies T, the first moving body T1 that is guided by and moves along the first guiding mast M1, and the second moving body T2 that is guided by and moves along the second guiding mast M2. Furthermore, the first moving body T1 includes the first transfer apparatus TS1 that transfers the container B to and from a transfer target location, and the second moving body T2 includes a second transfer apparatus TS2 that transfers the container B to and from a transfer target location.

Here, the movement path of the first moving body T1 guided by the first guiding mast M1 corresponds to the first movement path, and the movement path of the second moving body T2 guided by the second guiding mast M2 corresponds to the second movement path. As shown in FIG. 1, the first guiding mast M1 and the second guiding mast M2 are arranged in a positional relationship according to which the position in the vertical direction of the lower end portion of the first movement path and the position in the vertical direction of the upper end portion of the second movement path are overlapped in the overlap zone L. Furthermore, as shown in FIG. 2, the relay support platform N is arranged at a position that is not overlapped with either the first movement path or the second movement path, and enables transfer of the container B from both the first transfer apparatus TS1 and the second transfer apparatus TS2. Note that although four relay support platforms N are provided in a view along the vertical direction in FIG. 2, the present invention is not limited in this way. It should be noted that in the case where multiple relay support platforms N are provided at the same height in the vertical direction, they need to be arranged such that occupied regions of the container B in a view along the vertical direction do not overlap each other, and therefore it is preferable that the number of relay support platforms N provided at the same height in the vertical direction is set in view of the arrangement relationship of the first movement path and the second movement path.

Also, as shown in FIGS. 1 and 2, the first guiding mast M1, the first moving body T1, the first transfer apparatus TS1, the second guiding mast M2, the second moving body T2, the second transfer apparatus TS2, and the relay support platforms N are arranged inside the tubular body U.

As shown in FIG. 2, the first guiding mast M1 and the second guiding mast M2 are provided at a distance from each other in a view along the vertical direction. Also, the first guiding mast M1 and the second guiding mast M2 are provided in an arrangement according to which the movement path of the first moving body T1 and the movement path of the second moving body T2 have an overlap portion (overlap zone L) in a view along the vertical direction.

As shown in FIGS. 1, 3A, and 3B, the elevation main body portion TH of the first moving body T1 includes a ceiling plate TC in a fixed state above a region in which the container B supported by the container support body TY is located when the container support body TY is at the transport position in a view along the vertical direction. As shown in FIG. 1, a first proximity sensor S1 that detects the distance to the lower end portion of the elevation main body portion TH of the second moving body T2 is attached to the upper end of the ceiling plate TC. Also, an area sensor G1 is attached to the lower end portion of the elevation main body portion TH of the first moving body T1, and detects an interfering object below the lower end portion.

Also, as shown in FIGS. 1, 3A, and 3B, the elevation main body portion TH of the second moving body T2 includes a ceiling plate TC in a fixed state above a region in which the container B supported by the container support body TY is located when the container support body TY is at the transport position in a view along the vertical direction. As shown in FIG. 1, a second proximity sensor S2 that detects the distance to the upper end portion of the ceiling plate TC of the first moving body T1 is attached to the lower end portion of the elevation main body portion TH of the second moving body T2.

Each transfer apparatus C is configured by a roller conveyor that includes rollers distributed on the left and right sides. The distance between the pair of left and right rollers in the end portion of the transfer apparatus C on the interior space E1 side is larger than the width of the container support body TY in the left-right direction, and the container support body TY can pass up and down between this pair of rollers. Also, the end portion of the transfer apparatus C on the exterior space E2 side can transfer containers B to and from an operator or a transport carriage (not shown) that operates on the corresponding floor. Accordingly, via the transfer apparatus C, containers B can be transferred between the moving body T and an operator or a transport carriage that operates on the corresponding floor.

Figure 4:
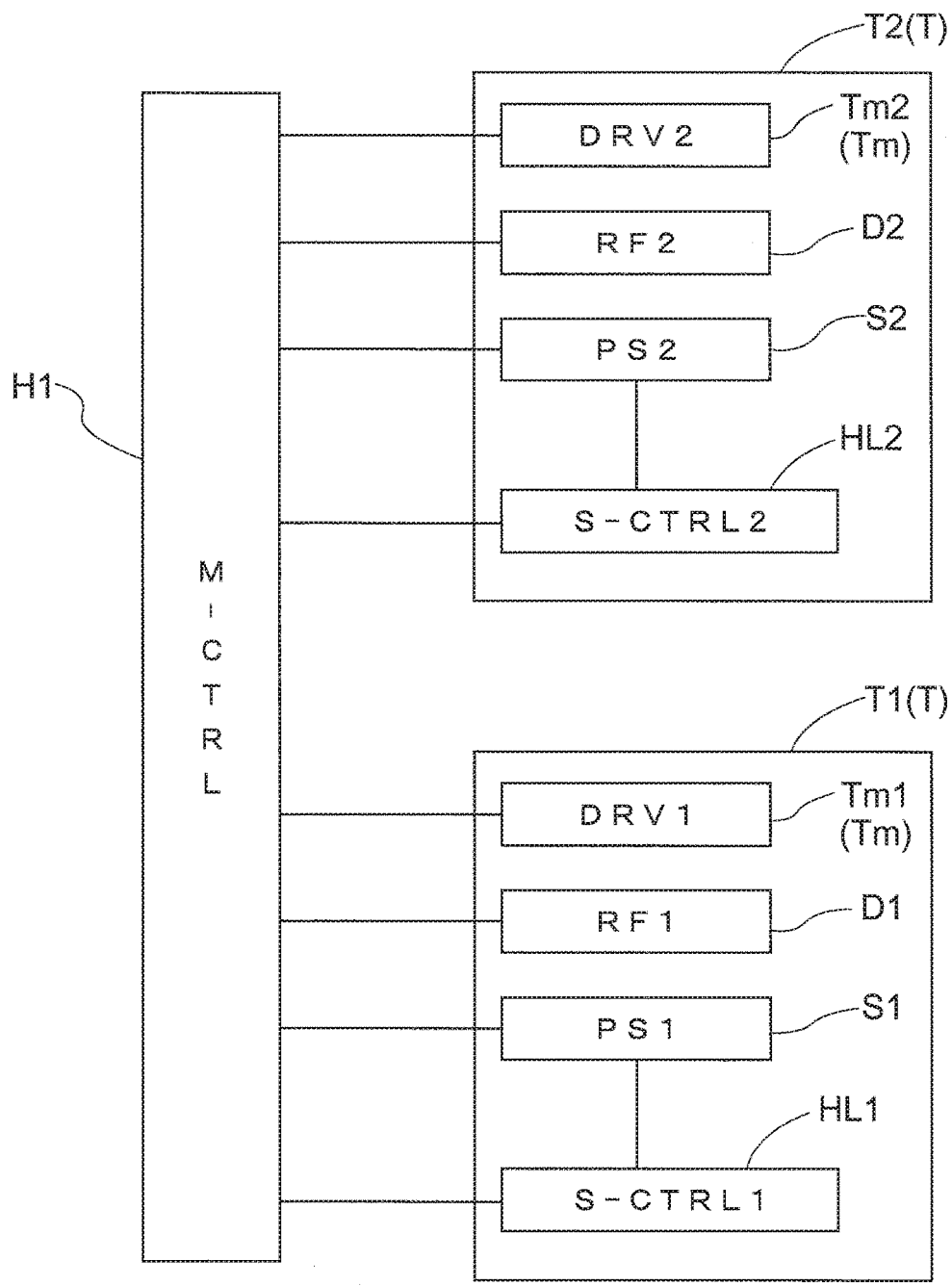
FIG. 4 is a control block diagram.

Next, the control configuration of the inter-floor transport apparatus K of the present embodiment will be described with reference to the block diagram of FIG. 4. A control device (M-CTRL) H1 is configured by a general-purpose computer such as a personal computer or a PC server that includes a central processing unit and a storage apparatus such as a hard disk, for example. Based on a transport request given by a step management apparatus (not shown) for managing semiconductor substrate processing steps in the semiconductor manufacturing factory, the control device H1 gives an instruction for the transport of a container B between the transfer apparatus C at the floor F on which the transport source processing device is provided and the transfer apparatus C at the floor F on which the transport destination processing device is provided.

The control device H1 is connected to the first elevation driving portion (DRV1) Tm1, a laser-type first range finder (RF1) D1 that is attached to the floor surface of the first floor F1 and detects the distance to the lower end portion of the elevation main body portion TH of the first moving body T1, and the first proximity sensor (PS1) S1, all of which correspond to the first moving body T1. In the present embodiment, the first range finder D1 corresponds to a first position detection portion. In other words, the inter-floor transport apparatus K is provided with the first range finder D1 that detects the position of the first moving body T1 in a direction extending along the movement path of the first moving body T1.

Based on measurement data from the first range finder D1 and a transport request from the step management apparatus, the control device H1 drives the first elevation driving portion Tm1 to cause the first moving body T1 to move up/down between a transport source target position and a transport destination target position, and controls operation of the first moving body T1 to drive the transfer apparatus constituted by the delivery arm TA and the like and transfer the container B at the respective target positions. In the present embodiment, the request from the step management apparatus corresponds to a transport request that includes information on the transport source and the transport destination of the transport target container B.

Also, the first moving body T1 includes a first local control portion (S-CTRL) HL1 that gives an operation instruction to the first elevation driving portion Tm1 based on detection information from the first proximity sensor S1. The first local control portion HL1 checks whether or not a control instruction has been received from the control device H1, and determines whether or not the control device H1 is operating normally.

If the first local control portion HL1 determines, based on detection information from the first proximity sensor S1, that a first proximity state exists in which the distance to the second moving body T2 in the vertical direction is less than or equal to a first set distance, the first local control portion HL1 causes the first elevation driving portion Tm1 to perform a collision avoidance operation. In the collision avoidance operation, the first local control portion HL1 controls movement of the first moving body T1 by causing the first elevation driving portion Tm1 to operate so as to reduce the movement speed of the first moving body T1 in order to avoid a collision between the first moving body T1 and the second moving body T2. In other words, in the present embodiment, a first proximity detection portion is configured by the first proximity sensor S1 and the first local control portion HL1. Also, control performed by the first local control portion HL1 for switching to the collision avoidance operation is performed with priority over the control performed by the control device H1. Note that the first set distance is set to a distance equivalent to the length of the later-described overlap zone L (see FIG. 1) in the vertical direction.

The control device H1 is connected to the second elevation driving portion (DRV2) Tm2, a laser-type second range finder (RF2) D2 that is attached to the ceiling of the fifth floor F5 (highest floor) and detects the distance to the upper end portion of the ceiling plate TC of the second moving body T2, and the second proximity sensor (PS2) S2, all of which correspond to the second moving body T2. In the present embodiment, the second range finder D2 corresponds to a second position detection portion. In other words, the inter-floor transport apparatus K is provided with the second range finder D2 that detects the position of the second moving body T2 in a direction extending along the movement path of the second moving body T2.

Based on measurement data from the second range finder D2 and a transport request from the step management apparatus, the control device H1 drives the second elevation driving portion Tm2 to cause the second moving body T2 to move up/down between a transport source target position and a transport destination target position, and controls operation of the second moving body T2 to drive the transfer apparatus constituted by the delivery arm TA and the like and transfer the container B at the respective target positions.

In other words, based on a transport request that includes information on the transport source and the transport destination of the transport target container B, and detection information from the first range finder D1 and the second range finder D2, the control device H1 controls movement of the first moving body T1 and the second moving body T2 by giving control instructions to the first moving body T1 and the second moving body T2.

The second moving body T2 includes a second local control portion HL2 that gives an operation instruction to the second elevation driving portion Tm2 based on detection information from the second proximity sensor S2. The second local control portion HL2 checks whether or not a control instruction has been received from the control device H1, and determines whether or not the control device H1 is operating normally.

If the second local control portion HL2 determines, based on detection information from the second proximity sensor S2, that a second proximity state exists in which the distance to the first moving body T1 in the vertical direction is less than or equal to a second set distance, the second local control portion HL2 causes the second elevation driving portion Tm2 to perform a collision avoidance operation. In the collision avoidance operation, the second local control portion HL2 controls movement of the second moving body T2 by causing the second elevation driving portion Tm2 to operate so as to reduce the movement speed of the second moving body T2 in order to avoid a collision between the second moving body T2 and the first moving body T1. In other words, in the present embodiment, a second proximity detection portion is configured by the second proximity sensor S2 and the second local control portion HL2. Also, control performed by the second local control portion HL2 for switching to the collision avoidance operation is performed with priority over the control performed the control device H1. Note that the second set distance is set to a distance equivalent to the length of the later-described overlap zone L (see FIG. 1) in the vertical direction.

The control device H1 stores, as an interference section, position information indicating the overlap zone L (see FIG. 1) of the upper end portion of the movement path of the first moving body T1 and the lower end portion of the movement path of the second moving body T2. In other words, the control device H1 stores section information indicating the first movement path, the second movement path, and the overlap zone L (interference section). This overlap zone L is set to include a section whose upper end is at the height of the upper end (ceiling plate TC) of the first moving body T1 when the first moving body T1 is located at the upper end of the first movement path, and whose lower end is at the height of the lower end of the second moving body T2 when the second moving body T2 is located at the lower end of the second movement path. Also, the relay support platforms N are provided within the overlap zone L in the vertical direction.

Moreover, the control device H1 stores the transfer apparatuses C at the first floor F1 and the second floor F2 and the relay support platforms N as transfer target locations for the first moving body T1, and stores the transfer apparatuses C at the fourth floor F4 and the fifth floor F5 and the relay support platforms N as transfer target locations for the second moving body T2.

Figure 5:
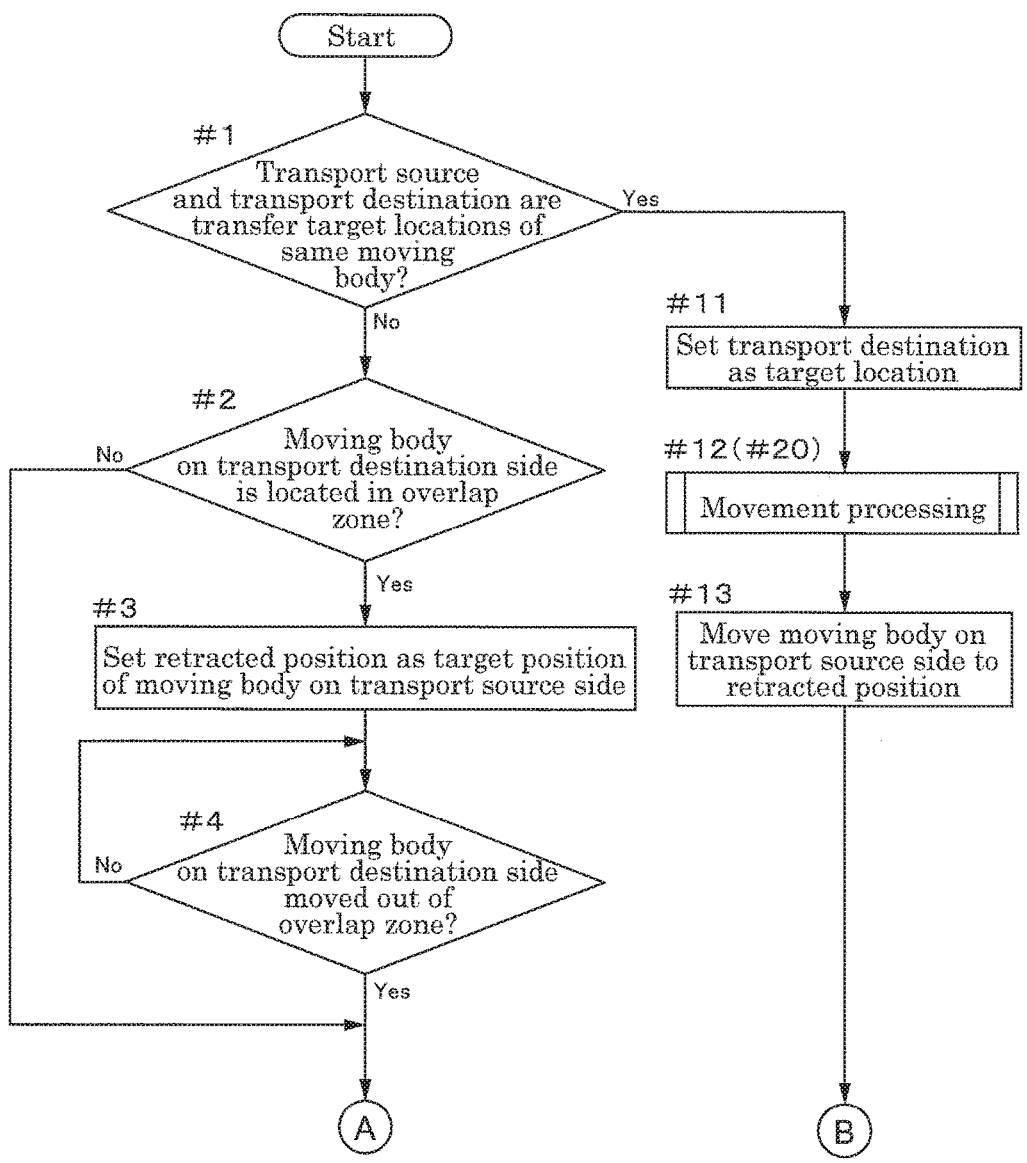
FIG. 5 is a flowchart of control.
Figure 6:
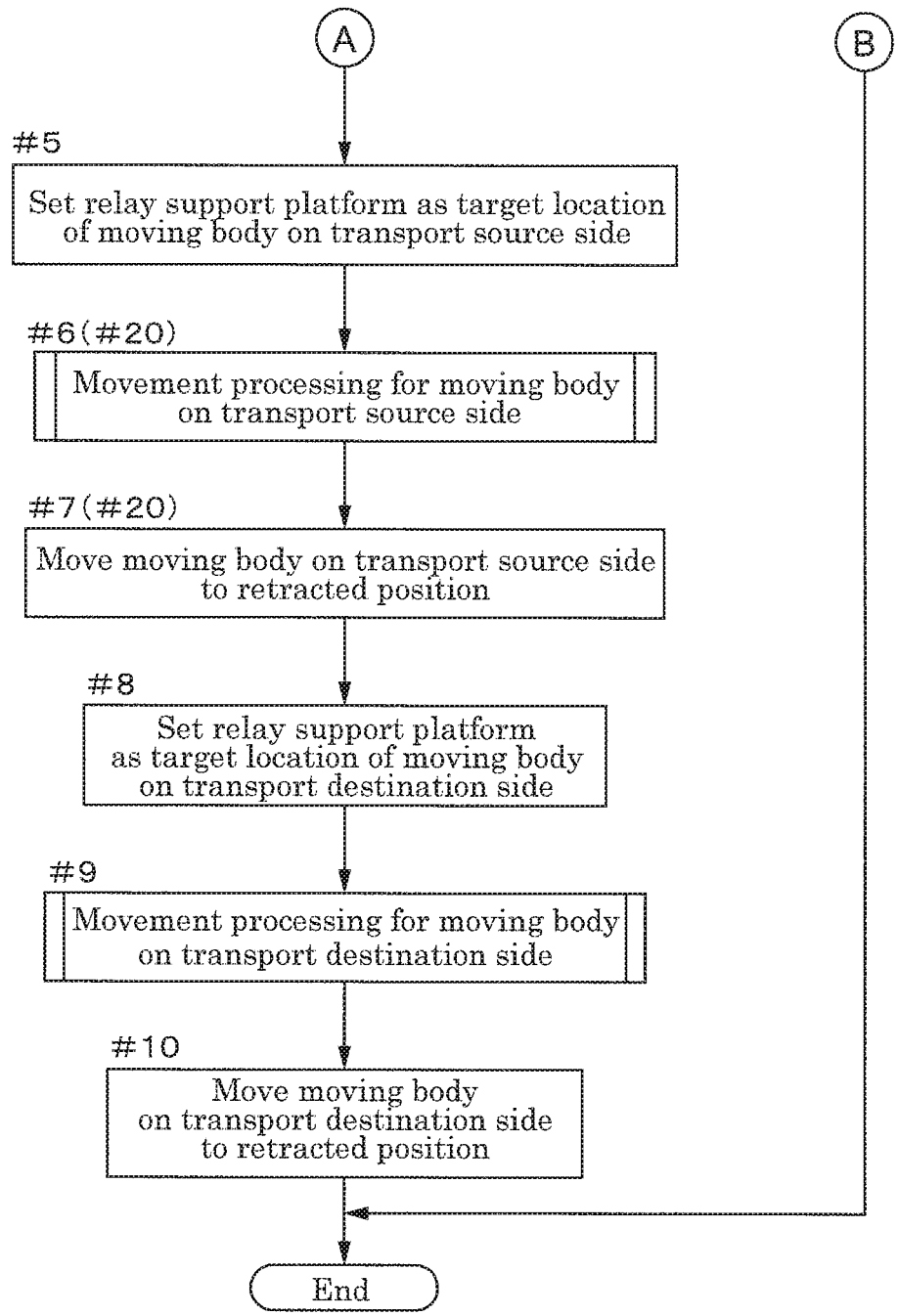
FIG. 6 is a flowchart of control.
Figure 7:
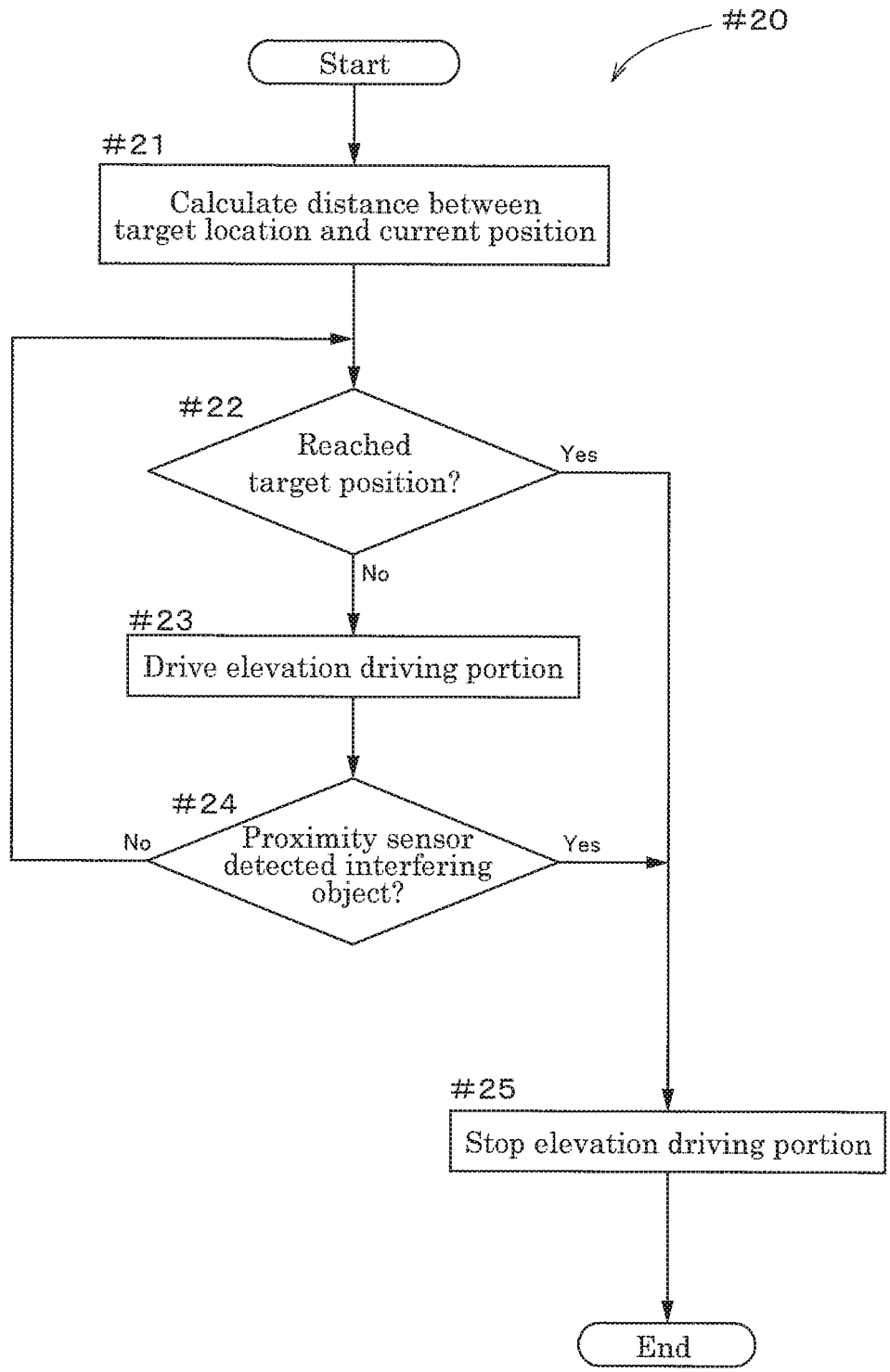
FIG. 7 is a flowchart of control.
Figure 8:
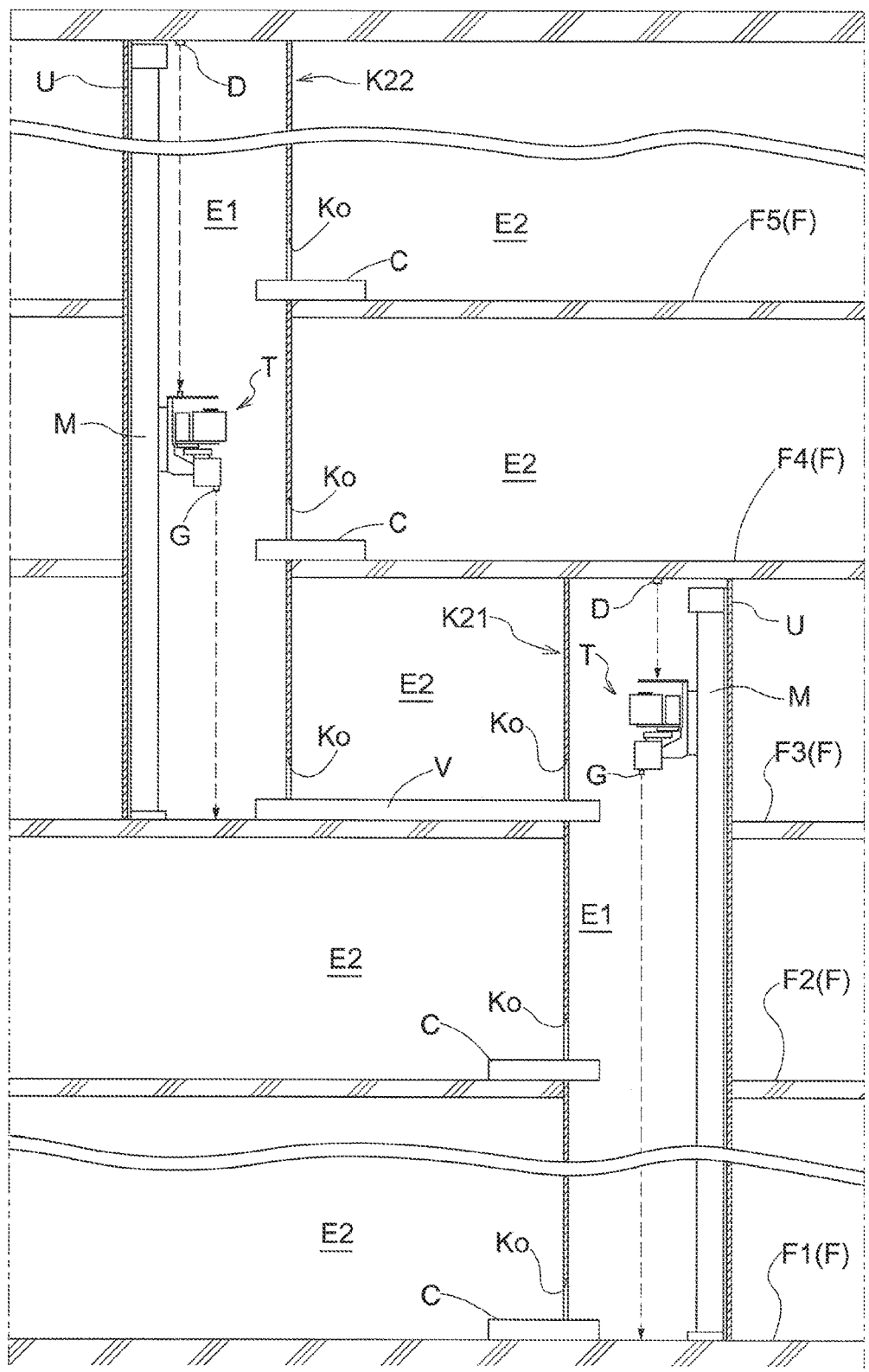
FIG. 8 is a cross-sectional side view of a conventional inter-floor transport apparatus.

Next, control executed by the control device H1, the first local control portion HL1, and the second local control portion HL2 will be described with reference to the flowcharts of FIGS. 5 to 7.

Note that the control device H1 controls operation of the first elevation driving portion Tm1 and the second elevation driving portion Tm2 such that when the first moving body T1 and the second moving body T2 have completed transport in accordance with a transport request from the step management apparatus and are waiting for the next transport request, the first moving body T1 and the second moving body T2 that are in the transport request standby state are not located in the overlap zone L. In other words, a position below the overlap zone L in the vertical direction is a retracted position of the first moving body T1, a position above the overlap zone L in the vertical direction is a retracted position of the second moving body T2, and operation of the first elevation driving portion Tm1 and the second elevation driving portion Tm2 is controlled such that the first moving body T1 and the second moving body T2 are located at these retracted positions when there are no incomplete transport requests.

The following description will be given with reference to the flowcharts of FIGS. 5 and 6. Based on a transport request from the step management apparatus, the control device H1 determines whether or not the transport source and the transport destination are positions on the movement path of the same moving body T in the vertical direction (in the present embodiment, whether or not the transport request is for transport between the first floor F1 and the second floor F2 or transport between the fourth floor F4 and the fifth floor F5) (step #1). If it is determined in step #1 that the transport source and the transport destination are not positions on the movement path of the same moving body T in the vertical direction (step #1: No), the control device H1 then determines whether or not the transport destination moving body T is located in the overlap zone L (step #2). If it is determined in step #2 that the transport destination moving body T is located in the overlap zone L (step #2: Yes), the target position of the transport source moving body T is set to the retracted position of the moving body T on the transport source side (step #3), and the moving body T on the transport source side is moved to the set position.

Upon determining that the moving body T on the transport destination side has moved out of the overlap zone L (step #4: Yes), the control device H1 sets the target position of the moving body T on the transport source side to a relay support platform N (step #5), and executes movement processing (described in detail later with reference to step #20 in FIG. 7) for the moving body T on the transport source side (step #6). When the movement processing of step #6 is complete, the moving body T on the transport source side is moved to the retracted position (step #7).

Next, the target position of the moving body T on the transport destination side is set to a relay support platform N (step #8), and movement processing is executed for the moving body T on the transport destination side (step #9 (#20)). When the movement processing of step #9 is complete, the moving body T on the transport destination side is moved to the retracted position (step #10).

Note that if the control device H1 determines in step #2 that the transport destination moving body T is not located in the overlap zone L, there is no concern of a collision between moving bodies T in the overlap zone L, and therefore the procedure moves to the processing of step #5.

Also, if the control device H1 determines in step #1 that the transport source and the transport destination are positions on the movement path of the same moving body T in the vertical direction (step #1: Yes), the moving body T on the transport source side and the moving body T on the transport destination side are the same moving body T, and therefore the control device H1 sets the transport destination as the target position (step #11) and executes movement processing of the moving body (step #12 (#20)). When the movement processing of step #12 is complete, the moving body T is moved to the retracted position (step #13).

Next, the movement processing routine will be described with reference to FIG. 7. The control device H1 calculates the distance between the target position and the current position of the moving body T detected by the first range finder D1 or the second range finder D2 (step #21), and determines whether or not the target position has been reached (step #22). If it is determined in step #22 that the target position has not been reached, the first elevation driving portion Tm1 or the second elevation driving portion Tm2 is driven to cause the moving body T to move (step #23). However, if the first proximity sensor S1 or the second proximity sensor S2 detects an interfering object (step #24: Yes), the first local control portion HL1 or the second local control portion HL2 is given priority over the control performed by the control device H1, and causes the first elevation driving portion Tm1 and the second elevation driving portion Tm2 to operate in a reduced speed state and then stop (step #25). In other words, control performed by the first local control portion HL1 for switching to the collision avoidance operation and control performed by the second local control portion HL2 for switching to the collision avoidance operation are performed with priority over the control performed by the control device H1.

The control device H1 executes the following control in the case of receiving a transport instruction in which either the transport source or the transport destination is the transfer target location of the first transfer apparatus TS1 in the case where the first moving body T1 is located in the section (non-interference section, first non-interference section L1) of the first movement path that excludes the interference section (overlap zone L), and the other one is the transfer target location of the second transfer apparatus TS2 in the case where the second moving body T2 is located in the section (non-interference section, second non-interference section L2) of the second movement path that excludes the interference section (overlap zone L). In other words, the control device H1 controls movement of the first moving body and the second moving body T2 such that out of the first moving body T1 and the second moving body T2, the moving body whose transfer target location is the transport source is allowed to enter the interference section with priority, and such that the state in which both the first moving body T1 and the second moving body T2 are located in the interference section is restricted.

According to the above configuration, the movement path of the first moving body T1 and the movement path of the second moving body T2 can be brought closer to each other to the extent of being at overlapping positions in a view along the vertical direction so as to reduce the installation space of the facility, and collision between the first moving body T1 and the second moving body T2 can also be appropriately avoided.

Other Embodiments (1) Although an example in which the transport target article is a container for housing a semiconductor substrate such as an FOUP or an FOSB is described above, the present invention is not limited to this configuration, and the transport target article may be reticle container or a glass substrate, for example. Also, although an example of using the article transport facility of the present invention in a semiconductor manufacturing factory is described in the above embodiment, the article transport facility may be used in a facility other than a semiconductor manufacturing factory, such as a food factory, and the transport target article may be any article.

(2) In the above description, the semiconductor manufacturing factory has five floors, the first guiding mast M1 is configured such that transport articles can be transported between floors from the first floor to the third floor, the second guiding mast M2 is configured such that transport articles can be transported between floors from the third floor to the fifth floor, and an overlap portion is provided in the third floor portion. However, the installation heights of the first guiding mast M1 and the second guiding mast M2 are not limited to heights that correspond to the floors described above.

(3) Although a configuration in which the relay support platforms N are provided at fixed positions in a view along the vertical direction is described above, the present invention is not limited to this configuration, and the relay support platforms N may be support platforms whose positions can be changed in a view along the vertical direction, for example.

(4) Although the first movement path and the second movement path are arranged to have portions that overlap each other in a view along the vertical direction in the above description, the first movement path and the second movement path may be provided at a distance from each other in a view along the vertical direction. Note that in this case as well, it is preferable that the positions of the first movement path and the second movement path in a view along the vertical direction are brought as close to each other as possible.

(5) Although a configuration in which the first position detection portion and the second position detection portion are laser-type range finders is described above, the present invention is not limited to this configuration. The first position detection portion and the second position detection portion can have various types of configurations, such as a configuration for performing position detection by detecting identifiers such as dogs or barcodes provided along the guiding masts M, for example. Also, the first position detection portion and the second position detection portion may have different types of position detection mechanisms.

(6) In the above description, in the case where the moving body T on the transport source side and the moving body T on the transport destination side are different moving bodies, the target position of the moving body on the transport source side is set to the retracted position of the moving body T on the transport source side if the moving body T on the transport destination side is located in the overlap zone L. However, the present invention is not limited to this configuration, and a configuration is possible in which the target position of the moving body on the transport source side is set at one of the relay support platforms N from the beginning, and movement of the moving body T on the transport source side toward the overlap zone L is restricted when the moving body T on the transport destination side is located in the overlap zone L.

(7) Although a configuration in which the first guiding mast M1, the first moving body T1, the first transfer apparatus TS1, the second guiding mast M2, the second moving body T2, the second transfer apparatus TS2, and the relay support platforms N are arranged inside the tubular body U is described above, a configuration is possible in which the tubular body U is not provided. Also, although the tubular body U is formed with a rectangular shape in a view along the vertical direction in the above embodiment, the shape of the tubular body U in a view along the vertical direction may be any shape, such as a shape having three sides or five sides or more, a circular shape, or a shape having a profiled cross-section with recessions/protrusions.

(8) Although a configuration in which the first set distance and the second set distance are set equivalent to the length of the overlap zone L in the vertical direction is described above, the first set distance and the second set distance may be set shorter than the length of the overlap zone L in the vertical direction. Also, the first set distance and the second set distance may be set to different distances. In this case, it is conceivable that the second set distance is longer in view of the tendency for a moving body to have a longer braking distance when moving downward, for example.

Summary of Embodiments

The following briefly describes a summary of the article transport facility described above.

In light of the above description, an article transport facility according to one aspect of the present invention is an article transport facility for transporting an article along a vertical direction, the article transport facility including:

a first guiding body arranged to extend along the vertical direction;

a second guiding body arranged to extend along the vertical direction;

a first moving body for article transport that is guided by the first guiding body and moves along the first guiding body;

a second moving body for article transport that is guided by the second guiding body and moves along the second guiding body; and a relay support platform that can support the article, wherein the first moving body includes a first transfer apparatus that transfers the article to and from a transfer target location, the second moving body includes a second transfer apparatus that transfers the article to and from a transfer target location, letting a movement path of the first moving body be a first movement path, and letting a movement path of the second moving body be a second movement path, the first guiding body and the second guiding body are arranged in a positional relationship according to which a position in the vertical direction of an upper end portion of the first movement path and a position in the vertical direction of a lower end portion of the second movement path are overlapped with each other, and the relay support platform is arranged at a position that is not overlapped with either the first movement path or the second movement path, and that enables the article to be transferred from both the first transfer apparatus and the second transfer apparatus.

In other words, the first moving body and the second moving body can transfer the article via the relay support platform, and therefore the transport target article can be appropriately transported in the vertical direction over a long distance that spans the first movement path and the second movement path. Also, the first moving body and the second moving body can relay the transport target article via the relay support platform, without providing the article transport facility with a transport apparatus for transporting articles in the horizontal direction. This makes it possible to realize a reduction in installation space. In this way, according to the above configuration, it is possible to provide an article transport facility that can appropriately transport articles even when the transport distance in the vertical direction is long, and moreover that is advantageous in terms of installation space.

Note that it is preferable that the relay support platform is provided in the overlap range of the first movement path and the second movement path in the vertical direction. In other words, the first moving body and the second moving body can each be located in the overlap range, and therefore if the position of the relay support platform in the vertical direction is set inside the overlap range, the first transfer apparatus and the second transfer apparatus can both easily access the relay support platform.

In the article transport facility according to the above aspect of the present invention, it is preferable that the relay support platform is arranged at a fixed position in a view along the vertical direction.

According to this configuration, the installation region in a view along the vertical direction can be made smaller than in the case where the position of the relay support platform in a view along the vertical direction can move. Accordingly, it is possible to provide an article transport facility that is even more advantageous in terms of installation space.

In the article transport facility according to the above aspect of the present invention, it is preferable that the first guiding body and the second guiding body are provided at a distance from each other in a view along the vertical direction, and the first movement path and the second movement path have portions that are overlapped with each other in a view along the vertical direction.

Compared to the case where the first movement path and the second movement path are not overlapped with each other in a view along the vertical direction, the region where the first moving body and the second moving body are provided in a view along the vertical direction can be made smaller in the case where the first movement path and the second movement path are overlapped with each other in a view along the vertical direction. Therefore, according to this configuration, it is possible to provide an article transport facility that is even more advantageous in terms of installation space.

Also, in another preferable aspect of the article transport facility, the article transport facility further includes:

a first position detection portion that detects a position of the first moving body;

a second position detection portion that detects a position of the second moving body; and a control device that, based on a transport request including information regarding a transport source and a transport destination of a transport target article, and detection information from the first position detection portion and the second position detection portion, controls movement of the first moving body and the second moving body by giving a control instruction to the first moving body and the second moving body, wherein letting an interference section be a section that includes, in the vertical direction, a section whose upper end is at a height at which an upper end of the first moving body is located when the first moving body is located at an upper end of the first movement path, and whose lower end is at a height at which a lower end of the second moving body is located when the second moving body is located at a lower end of the second movement path, letting a first non-interference section be a section of the first movement path that excludes a section corresponding to the interference section in the vertical direction, and letting a second non-interference section be a section of the second movement path that excludes a section corresponding to the interference section in the vertical direction, in a case where either the transport source or the transport destination included in the transport request is the transfer target location of the first transfer apparatus in a case where the first moving body is located in the first non-interference section, and the other one is the transfer target location of the second transfer apparatus in a case where the second moving body is located in the second non-interference section, the control device controls movement of the first moving body and the second moving body such that, out of the first moving body and the second moving body, the moving body whose movement path includes the transport source is allowed to enter the interference section with priority, and such that a state in which both the first moving body and the second moving body are located in the interference section is restricted.

According to this configuration, out of the first moving body and the second moving body, the moving body that is supporting the transport target object received at the transport source is allowed to enter the interference section with priority, the article is then transferred to a relay support platform, and the moving body moves out of the interference section. The moving body that did not support the article then enters the interference section, receives the article from the relay support platform, and transports the article to the transport destination. In other words, when an article is transported by the first moving body and the second moving body via the relay support platform, movement of the first moving body and the second moving body is controlled such that a state in which both the first moving body and the second moving body are located in the interference section does not arise. For this reason, it is possible to reduce the possibility of contact between the first moving body and the second moving body.

Also, in another preferable aspect of the article transport facility, the first moving body includes a first proximity detection portion that detects a first proximity state in which a distance to the second moving body in the vertical direction is less than or equal to a first set distance, and a first moving body control portion that controls movement of the first moving body based on detection information from the first proximity detection portion, the second moving body includes a second proximity detection portion that detects a second proximity state in which a distance to the first moving body in the vertical direction is less than or equal to a second set distance, and a second moving body control portion that controls movement of the second moving body based on detection information from the second proximity detection portion, in a case where the first proximity detection portion detected the first proximity state, the first moving body control portion is given priority over control performed by the control device, and switches operation of the first moving body to a collision avoidance operation for avoiding collision with the second moving body, and in a case where the second proximity detection portion detected the second proximity state, the second moving body control portion is given priority over control performed by the control device, and switches operation of the second moving body to a collision avoidance operation for avoiding collision with the first moving body.

According to this configuration, in the case where the distance from the first moving body to the second moving body is less than or equal to the first set distance, the first moving body control portion is given priority over the control performed by the control device, and switches operation of the first moving body to the collision avoidance operation. Also, in the case where the distance from the second moving body to the first moving body is less than or equal to the second set distance, the second moving body control portion is given priority over the control performed by the control device, and switches operation of the second moving body to the collision avoidance operation. For this reason, even in the case where the control device cannot appropriately control the first moving body and the second moving body due to a failure in the control device, a delay in control, or the like, it is possible to appropriately avoid a situation in which the first moving body and the second moving body come into contact with each other. Note that it is preferable that the first set distance and the second set distance are set to lengths the same as or less than the length of the interference section.

In the article transport facility according to the above aspect of the present invention, it is preferable that the first moving body control portion controls operation of the first moving body such that at least a moving speed of the first moving body is reduced, as the collision avoidance operation, and the second moving body control portion controls operation of the second moving body such that at least a moving speed of the second moving body is reduced, as the collision avoidance operation.

The first moving body control portion and the second moving body control portion reduce the moving speed of the first moving body and the second moving body as the collision avoidance operation, thus making it easier to avoid contact between the second moving body and the first moving body. Also, even if contact occurs, the impact at that time can be reduced as much as possible.

Also, in another preferable aspect of the article transport facility, the first guiding body, the first moving body, the first transfer apparatus, the second guiding body, the second moving body, the second transfer apparatus, and the relay support platform are arranged inside a tubular body having a hollow portion that extends along the vertical direction.

By arranging the first guiding body, the first moving body, the first transfer apparatus, the second guiding body, the second moving body, the second transfer apparatus, and the relay support platform inside the same tubular body, it is possible to reduce the amount of space required for the article transport facility. For this reason, it is possible to reduce the amount of area occupied by the article transport facility at the factory or the like where the article transport device is provided.

The invention claimed is:
1. An article transport facility for transporting an article along a vertical direction, the article transport facility comprising:
   a first guiding body arranged to extend along the vertical direction;
   a second guiding body arranged to extend along the vertical direction;
   a first moving body for article transport that is guided by the first guiding body and moves along the first guiding body;
   a second moving body for article transport that is guided by the second guiding body and moves along the second guiding body; and
   a relay support platform that can support the article,
   wherein:
   the first moving body includes a first transfer apparatus that transfers the article to and from a transfer target location,
   the second moving body includes a second transfer apparatus that transfers the article to and from a transfer target location,
   a movement path of the first moving body is defined as a first movement path, and a movement path of the second moving body is defined as a second movement path,
   a lower end portion of the first guiding body extends below the entirety of the second guiding body in the vertical direction, and an upper end portion of the second guiding body extends above the entirety of the first guiding body in the vertical direction, the first guiding body and the second guiding body are arranged in a positional relationship according to which a position in the vertical direction of the upper end portion of the first guiding body and a position in the vertical direction of the lower end portion of the second guiding body are overlapped with each other, and the relay support platform is arranged at a position that is not overlapped with either the first movement path or the second movement path, and that enables the article to be transferred from both the first transfer apparatus and the second transfer apparatus.

2. The article transport facility according to claim 1, wherein the relay support platform is arranged at a fixed position in a view along the vertical direction.

3. The article transport facility according to claim 2, wherein the first guiding body and the second guiding body are provided at a distance from each other in a view along the vertical direction, and the first movement path and the second movement path have portions that are overlapped with each other in a view along the vertical direction.

4. The article transport facility according to claim 1, wherein the first guiding body and the second guiding body are provided at a distance from each other in a view along the vertical direction, and the first movement path and the second movement path have portions that are overlapped with each other in a view along the vertical direction.

5. The article transport facility according to claim 1, wherein each of the first guiding body and the second guiding body is provided at a fixed position relative to the relay support platform.

6. An article transport facility for transporting an article along a vertical direction, the article transport facility comprising:

a first guiding body arranged to extend along the vertical direction;

a second guiding body arranged to extend along the vertical direction;

a first moving body for article transport that is guided by the first guiding body and moves along the first guiding body;

a second moving body for article transport that is guided by the second guiding body and moves along the second guiding body;

a relay support platform that can support the article;

a first position detection portion that detects a position of the first moving body;

a second position detection portion that detects a position of the second moving body; and a control device that, based on a transport request including information regarding a transport source and a transport destination of a transport target article, and detection information from the first position detection portion and the second position detection portion, controls movement of the first moving body and the second moving body by giving a control instruction to the first moving body and the second moving body, wherein:

the first moving body includes a first transfer apparatus that transfers the article to and from a transfer target location, the second moving body includes a second transfer apparatus that transfers the article to and from a transfer target location, a movement path of the first moving body is defined as a first movement path, and a movement path of the second moving body is defined as a second movement path, the first guiding body and the second guiding body are arranged in a positional relationship according to which a position in the vertical direction of an upper end portion of the first movement path and a position in the vertical direction of a lower end portion of the second movement path are overlapped with each other, the relay support platform is arranged at a position that is not overlapped with either the first movement path or the second movement path, and that enables the article to be transferred from both the first transfer apparatus and the second transfer apparatus, the first guiding body and the second guiding body are provided at a distance from each other in a view along the vertical direction, the first movement path and the second movement path have portions that are overlapped with each other in a view along the vertical direction, an interference section comprises a section that includes, in the vertical direction, a section whose upper end is at a height at which an upper end of the first moving body is located when the first moving body is located at an upper end of the first movement path, and whose lower end is at a height at which a lower end of the second moving body is located when the second moving body is located at a lower end of the second movement path, a first non-interference section comprises a section of the first movement path that excludes a section corresponding to the interference section in the vertical direction, and a second non-interference section comprises a section of the second movement path that excludes a section corresponding to the interference section in the vertical direction, in a case where either the transport source or the transport destination included in the transport request is the transfer target location of the first transfer apparatus in a case where the first moving body is located in the first non-interference section, and the other one is the transfer target location of the second transfer apparatus in a case where the second moving body is located in the second non-interference section, and the control device controls movement of the first moving body and the second moving body such that, out of the first moving body and the second moving body, the moving body whose movement path includes the transport source is allowed to enter the interference section with priority, and such that a state in which both the first moving body and the second moving body are located in the interference section is restricted.

7. The article transport facility according to claim 6, wherein the first moving body includes a first proximity detection portion that detects a first proximity state in which a distance to the second moving body in the vertical direction is less than or equal to a first set distance, and a first moving body control portion that controls movement of the first moving body based on detection information from the first proximity detection portion, the second moving body includes a second proximity detection portion that detects a second proximity state in which a distance to the first moving body in the vertical direction is less than or equal to a second set distance, and a second moving body control portion that controls movement of the second moving body based on detection information from the second proximity detection portion, in a case where the first proximity detection portion detected the first proximity state, the first moving body control portion is given priority over control performed by the control device, and switches operation of the first moving body to a collision avoidance operation for avoiding collision with the second moving body, and in a case where the second proximity detection portion detected the second proximity state, the second moving body control portion is given priority over control performed by the control device, and switches operation of the second moving body to a collision avoidance operation for avoiding collision with the first moving body.

8. The article transport facility according to claim 7, wherein the first moving body control portion controls operation of the first moving body such that at least a moving speed of the first moving body is reduced, as the collision avoidance operation, and the second moving body control portion controls operation of the second moving body such that at least a moving speed of the second moving body is reduced, as the collision avoidance operation.

9. The article transport facility according to claim 8, wherein the first guiding body, the first moving body, the first transfer apparatus, the second guiding body, the second moving body, the second transfer apparatus, and the relay support platform are arranged inside a tubular body having a hollow portion that extends along the vertical direction.

10. The article transport facility according to claim 7, wherein the first guiding body, the first moving body, the first transfer apparatus, the second guiding body, the second moving body, the second transfer apparatus, and the relay support platform are arranged inside a tubular body having a hollow portion that extends along the vertical direction.

11. The article transport facility according to claim 6, wherein the first guiding body, the first moving body, the first transfer apparatus, the second guiding body, the second moving body, the second transfer apparatus, and the relay support platform are arranged inside a tubular body having a hollow portion that extends along the vertical direction.

12. An article transport facility for transporting an article along a vertical direction, the article transport facility comprising:

a first guiding body arranged to extend along the vertical direction;

a second guiding body arranged to extend along the vertical direction;

a first moving body for article transport that is guided by the first guiding body and moves along the first guiding body;

a second moving body for article transport that is guided by the second guiding body and moves along the second guiding body;

a relay support platform that can support the article;

a first position detection portion that detects a position of the first moving body;

a second position detection portion that detects a position of the second moving body; and a control device that, based on a transport request including information regarding a transport source and a transport destination of a transport target article, and detection information from the first position detection portion and the second position detection portion, controls movement of the first moving body and the second moving body by giving a control instruction to the first moving body and the second moving body, wherein:

the first moving body includes a first transfer apparatus that transfers the article to and from a transfer target location, the second moving body includes a second transfer apparatus that transfers the article to and from a transfer target location, a movement path of the first moving body is defined as a first movement path, and a movement path of the second moving body is defined as a second movement path, the first guiding body and the second guiding body are arranged in a positional relationship according to which a position in the vertical direction of an upper end portion of the first movement path and a position in the vertical direction of a lower end portion of the second movement path are overlapped with each other, the relay support platform is arranged at a position that is not overlapped with either the first movement path or the second movement path, and that enables the article to be transferred from both the first transfer apparatus and the second transfer apparatus, the relay support platform is arranged at a fixed position in a view along the vertical direction, the first guiding body and the second guiding body are provided at a distance from each other in a view along the vertical direction, the first movement path and the second movement path have portions that are overlapped with each other in a view along the vertical direction, an interference section comprises a section that includes, in the vertical direction, a section whose upper end is at a height at which an upper end of the first moving body is located when the first moving body is located at an upper end of the first movement path, and whose lower end is at a height at which a lower end of the second moving body is located when the second moving body is located at a lower end of the second movement path, a first non-interference section comprises a section of the first movement path that excludes a section corresponding to the interference section in the vertical direction, and a second non-interference section comprises a section of the second movement path that excludes a section corresponding to the interference section in the vertical direction, in a case where either the transport source or the transport destination included in the transport request is the transfer target location of the first transfer apparatus in a case where the first moving body is located in the first non-interference section, and the other one is the transfer target location of the second transfer apparatus in a case where the second moving body is located in the second non-interference section, the control device controls movement of the first moving body and the second moving body such that, out of the first moving body and the second moving body, the moving body whose movement path includes the transport source is allowed to enter the interference section with priority, and such that a state in which both the first moving body and the second moving body are located in the interference section is restricted.

13. The article transport facility according to claim 12,
wherein the first moving body includes a first proximity detection portion that detects a first proximity state in which a distance to the second moving body in the vertical direction is less than or equal to a first set distance, and a first moving body control portion that controls movement of the first moving body based on detection information from the first proximity detection portion,
the second moving body includes a second proximity detection portion that detects a second proximity state in which a distance to the first moving body in the vertical direction is less than or equal to a second set distance, and a second moving body control portion that controls movement of the second moving body based on detection information from the second proximity detection portion,
in a case where the first proximity detection portion detected the first proximity state, the first moving body control portion is given priority over control performed by the control device, and switches operation of the first moving body to a collision avoidance operation for avoiding collision with the second moving body, and
in a case where the second proximity detection portion detected the second proximity state, the second moving body control portion is given priority over control performed by the control device, and switches operation of the second moving body to a collision avoidance operation for avoiding collision with the first moving body.

14. The article transport facility according to claim 13,
wherein the first moving body control portion controls operation of the first moving body such that at least a moving speed of the first moving body is reduced, as the collision avoidance operation, and
the second moving body control portion controls operation of the second moving body such that at least a moving speed of the second moving body is reduced, as the collision avoidance operation.

15. The article transport facility according to claim 13, wherein the first guiding body, the first moving body, the first transfer apparatus, the second guiding body, the second moving body, the second transfer apparatus, and the relay support platform are arranged inside a tubular body having a hollow portion that extends along the vertical direction.

16. The article transport facility according to claim 12, wherein the first guiding body, the first moving body, the first transfer apparatus, the second guiding body, the second moving body, the second transfer apparatus, and the relay support platform are arranged inside a tubular body having a hollow portion that extends along the vertical direction.

17. An article transport facility for transporting an article along a vertical direction, the article transport facility comprising:
a first guiding body arranged to extend along the vertical direction;
a second guiding body arranged to extend along the vertical direction;
a first moving body for article transport that is guided by the first guiding body and moves along the first guiding body;
a second moving body for article transport that is guided by the second guiding body and moves along the second guiding body; and
a relay support platform that can support the article, wherein:
the first moving body includes a first transfer apparatus that transfers the article to and from a transfer target location,
the second moving body includes a second transfer apparatus that transfers the article to and from a transfer target location,
a movement path of the first moving body is defined as a first movement path, and a movement path of the second moving body is defined as a second movement path,
the first guiding body and the second guiding body are arranged in a positional relationship according to which a position in the vertical direction of an upper end portion of the first movement path and a position in the vertical direction of a lower end portion of the second movement path are overlapped with each other,
the relay support platform is arranged at a position that is not overlapped with either the first movement path or the second movement path, and that enables the article to be transferred from both the first transfer apparatus and the second transfer apparatus, and
the first guiding body, the first moving body, the first transfer apparatus, the second guiding body, the second moving body, the second transfer apparatus, and the relay support platform are arranged inside a tubular body having a hollow portion that extends along the vertical direction.

18. An article transport facility for transporting an article along a vertical direction, the article transport facility comprising:
a first guiding body arranged to extend along the vertical direction;
a second guiding body arranged to extend along the vertical direction;
a first moving body for article transport that is guided by the first guiding body and moves along the first guiding body;
a second moving body for article transport that is guided by the second guiding body and moves along the second guiding body; and
a relay support platform that can support the article, wherein:
the first moving body includes a first transfer apparatus that transfers the article to and from a transfer target location,
the second moving body includes a second transfer apparatus that transfers the article to and from a transfer target location,
a movement path of the first moving body is defined as a first movement path, and a movement path of the second moving body is defined as a second movement path,
a lower end portion of the first movement path is positioned lower than a lower end portion of the second movement path, and an upper end portion of the second movement path is positioned higher than an upper end portion of the first movement path,
the first guiding body and the second guiding body are arranged in a positional relationship according to which a position in the vertical direction of the upper end portion of the first movement path and a position in the vertical direction of the lower end portion of the second movement path are overlapped with each other,
the relay support platform is arranged at a position that is not overlapped with either the first movement path or the second movement path, and that enables the article to be transferred from both the first transfer apparatus and the second transfer apparatus, the relay support platform is arranged at a fixed position in a view along the vertical direction, and the first guiding body, the first moving body, the first transfer apparatus, the second guiding body, the second moving body, the second transfer apparatus, and the relay support platform are arranged inside a tubular body having a hollow portion that extends along the vertical direction.

19. An article transport facility for transporting an article along a vertical direction, the article transport facility comprising:

a first guiding body arranged to extend along the vertical direction;

a second guiding body arranged to extend along the vertical direction;

a first moving body for article transport that is guided by the first guiding body and moves along the first guiding body;

a second moving body for article transport that is guided by the second guiding body and moves along the second guiding body; and a relay support platform that can support the article, wherein:

the first moving body includes a first transfer apparatus that transfers the article to and from a transfer target location, the second moving body includes a second transfer apparatus that transfers the article to and from a transfer target location, a movement path of the first moving body is defined as a first movement path, and a movement path of the second moving body is defined as a second movement path, a lower end portion of the first movement path is positioned lower than a lower end portion of the second movement path, and an upper end portion of the second movement path is positioned higher than an upper end portion of the first movement path, the first guiding body and the second guiding body are arranged in a positional relationship according to which a position in the vertical direction of the upper end portion of the first movement path and a position in the vertical direction of the lower end portion of the second movement path are overlapped with each other, the relay support platform is arranged at a position that is not overlapped with either the first movement path or the second movement path, and that enables the article to be transferred from both the first transfer apparatus and the second transfer apparatus, the first guiding body and the second guiding body are provided at a distance from each other in a view along the vertical direction, the first movement path and the second movement path have portions that are overlapped with each other in a view along the vertical direction, and the first guiding body, the first moving body, the first transfer apparatus, the second guiding body, the second moving body, the second transfer apparatus, and the relay support platform are arranged inside a tubular body having a hollow portion that extends along the vertical direction.

20. An article transport facility for transporting an article along a vertical direction, the article transport facility comprising:

a first guiding body arranged to extend along the vertical direction;

a second guiding body arranged to extend along the vertical direction;

a first moving body for article transport that is guided by the first guiding body and moves along the first guiding body;

a second moving body for article transport that is guided by the second guiding body and moves along the second guiding body; and a relay support platform that can support the article, wherein:

the first moving body includes a first transfer apparatus that transfers the article to and from a transfer target location, the second moving body includes a second transfer apparatus that transfers the article to and from a transfer target location, a movement path of the first moving body is defined as a first movement path, and a movement path of the second moving body is defined as a second movement path, a lower end portion of the first movement path is positioned lower than a lower end portion of the second movement path, and an upper end portion of the second movement path is positioned higher than an upper end portion of the first movement path, the first guiding body and the second guiding body are arranged in a positional relationship according to which a position in the vertical direction of the upper end portion of the first movement path and a position in the vertical direction of the lower end portion of the second movement path are overlapped with each other, the relay support platform is arranged at a position that is not overlapped with either the first movement path or the second movement path, and that enables the article to be transferred from both the first transfer apparatus and the second transfer apparatus, the relay support platform is arranged at a fixed position in a view along the vertical direction, the first guiding body and the second guiding body are provided at a distance from each other in a view along the vertical direction, the first movement path and the second movement path have portions that are overlapped with each other in a view along the vertical direction, and the first guiding body, the first moving body, the first transfer apparatus, the second guiding body, the second moving body, the second transfer apparatus, and the relay support platform are arranged inside a tubular body having a hollow portion that extends along the vertical direction.

* * * * *

UNITED STATES PATENT AND TRADEMARK OFFICE
CERTIFICATE OF CORRECTION

PATENT NO. : 10,486,903 B2  
APPLICATION NO. : 15/389511  
DATED : November 26, 2019  
INVENTOR(S) : Hideo Yoshioka et al.

Page 1 of 1

It is certified that error appears in the above-identified patent and that said Letters Patent is hereby corrected as shown below:

On the Title Page

Column 1, Item (73) Assignee, Line 1, delete "Daifiki" and insert -- Daifuku --

In the Claims

Column 17, Line 20, Claim 3, delete "the first" and insert -- wherein the first --

Column 18, Line 64, Claim 7, before "the" insert -- wherein --

Column 19, Line 5, Claim 7, before "in" insert -- wherein --

Column 19, Line 11, Claim 7, before "in" insert -- wherein --

Column 19, Line 23, Claim 8, before "the" insert -- wherein --

Column 21, Line 10, Claim 13, before "the" insert -- wherein --

Column 21, Line 19, Claim 13, before "in" insert -- wherein --

Column 21, Line 25, Claim 13, before "in" insert -- wherein --

Column 21, Line 38, Claim 14, before "the" insert -- wherein --

Signed and Sealed this  
Ninth Day of June, 2020

Andrei Iancu  
*Director of the United States Patent and Trademark Office*